(12) United States Patent
Chen et al.

(10) Patent No.: US 7,102,389 B2
(45) Date of Patent: Sep. 5, 2006

(54) VOLTAGE TRANSLATOR WITH DATA BUFFER

(75) Inventors: David Jia Chen, Endwell, NY (US); Michael Kevin Kerr, Johnson City, NY (US); William Frederick Lawson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 10/926,934

(22) Filed: Aug. 26, 2004

(65) Prior Publication Data

US 2006/0044014 A1    Mar. 2, 2006

(51) Int. Cl.
*H03K 19/0175*    (2006.01)
(52) U.S. Cl. .............................. 326/81; 326/82; 326/80
(58) Field of Classification Search ............ 326/80–82, 326/104
See application file for complete search history.

(56) References Cited

U.S. PATENT DOCUMENTS

| | | | | |
|---|---|---|---|---|
| 5,126,588 A | * | 6/1992 | Reichmeyer et al. | 327/108 |
| 5,272,481 A | * | 12/1993 | Sauer | 341/165 |
| 5,760,621 A | * | 6/1998 | Keeth | 327/112 |
| 5,999,033 A | * | 12/1999 | Keeth et al. | 327/333 |
| 6,127,849 A | * | 10/2000 | Walker | 326/86 |

OTHER PUBLICATIONS

Michael Lewis, 1999 Online reference for Fig 1, 2: http://www.geocities.com/cmoslayoutdesign/gmask/gmask04.html.*

* cited by examiner

*Primary Examiner*—Rexford Barnie
*Assistant Examiner*—Jason Crawford
(74) *Attorney, Agent, or Firm*—Joan Pennington

(57) ABSTRACT

A voltage translator with data buffer includes an input inverter receiving a data input signal at a first voltage level. A level shifting cross-coupled NOR circuit is coupled to the input inverter for translating the data input signal at a second voltage level. An output stage driven by the level shifting cross-coupled NOR circuit for providing a data output signal at the second voltage level. The voltage translator enables improved performance across various power, voltage and temperature (PVT) conditions and reliably reduces or minimizes shoot through current and delay.

16 Claims, 2 Drawing Sheets

PRIOR ART

US 7,102,389 B2

VOLTAGE TRANSLATOR WITH DATA BUFFER

FIELD OF THE INVENTION

The present invention relates generally to the integrated circuit design field, and more particularly, relates to a voltage translator with data buffer.

DESCRIPTION OF THE RELATED ART

Various voltage translator or voltage level shifter arrangements are known. A voltage translator translates data from one voltage to another voltage, typically from a lower to higher voltage. The voltage translator also is useable as an output buffer adapted for minimizing shoot through current.

Voltage translators are widely used. Many voltage translators use latching mechanisms to eliminate DC current after the data has been translated.

A problem with many voltage translators is reliability and delay over wide voltage ranges, temperature ranges, and process lots.

FIG. 1 illustrates a conventional voltage translator. The conventional voltage translator includes an input A applied to a gate input of an input inverter defined by a series connected P-channel field effect transistor (PFET) 101 and an N-channel field effect transistor (NFET) 102 connected between a first voltage supply VDD and ground. A cross-coupled inverter circuit including series connected PFET 103, NFET 104, and series connected PFET 105, NFET 106 connected between a second voltage supply VDD2 and ground. An output driving pair of series connected PFET 107, NFET 108 is connected between the second voltage supply VDD2 and ground, is driven by the cross-coupled circuit.

In the conventional voltage translator, an inverted input A provided at the common drain connection of PFET 101 and NFET 102 is applied to the gate of NFET 104. The input A is applied to the gate of NFET 106. The common drain connection of PFET 105 and NFET 106 is applied to the gate input of the output PFET 107, and NFET 108. The common drain connection of the output PFET 107, and NFET 108 provides output Z of the conventional voltage translator.

A problem with the conventional voltage translator of FIG. 1 is the difficulty to tune the voltage translator. Modifying one transistor of the conventional voltage translator of FIG. 1 typically has too great an affect on several factors that might not need to be changed. For example, if the width of NFET 108 is increased, then the falling slew rate becomes faster. However, then the switch point of the output inverter is lower so that the output falling delay is faster while the rising delay slows down. Further for example, if the width of NFET 106 is increased to improve the rising delay, this also decreases the output falling delay and slows down the output falling slew rate.

Another problem with the conventional voltage translator of FIG. 1 is the difficulty to switch states of the cross-coupled inverter circuit. The NFET 104 and NFET 106 are required to overpower the PFET 103, and PFET 105 to switch states. When the input A switches from high to low, NFET 104 will compete with PFET 103 in order to pull the gate of PFET 105 low. Only when the gate of PFET 105 is low will the PFET 105 turn on and pull the gate of PFET 103 to rise to a high state and turn off the PFET 103. Similar switching occurs when the input A switches from low to high.

A need exists for a voltage translator enabling improved performance across required power, voltage and temperature (PVT) conditions. It is also desirable to provide such improved voltage translator that reliably reduces or minimizes shoot through current and delay.

SUMMARY OF THE INVENTION

A principal aspect of the present invention is to provide a voltage translator with a data buffer. Other important aspects of the present invention are to provide such voltage translator with a data buffer substantially without negative effect and that overcome some of the disadvantages of prior art arrangements.

In brief, a voltage translator with data buffer is provided. The voltage translator includes an input inverter receiving a data input signal at a first voltage level. A level shifting cross-coupled NOR circuit is coupled to the input inverter for translating the data input signal at a second voltage level. An output stage driven by the level shifting cross-coupled NOR circuit for providing a data output signal at the second voltage level.

In accordance with features of the invention, the level shifting cross-coupled NOR circuit includes a first and second cross-coupled NORs. Each of the cross-coupled NORs includes a pair of series connected P-channel field effect transistors (PFETs) and an N-channel field effect transistor (NFET) connected between the second voltage level and ground. The input inverter is defined by a series connected P-channel field effect transistor (PFET) and an N-channel field effect transistor (NFET), each having a gate receiving the data input signal and providing an inverted data signal. The data input signal is applied to a gate of the NFET and a gate of the PFET series connected to the NFET of the first cross-coupled NOR. The inverted data signal is applied to a gate of the NFET and a gate of the PFET series connected to the NFET of the second cross-coupled NOR. These respective PFETs of the first and second cross-coupled NORs are turned off by the applied gate input that turns on the series connected NFET, enabling faster performance.

In accordance with features of the invention, the output stage of the voltage translator includes an output PFET and an output NFET. The output PFET and the output NFET are driven separately by the respective first and second cross-coupled NORs.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
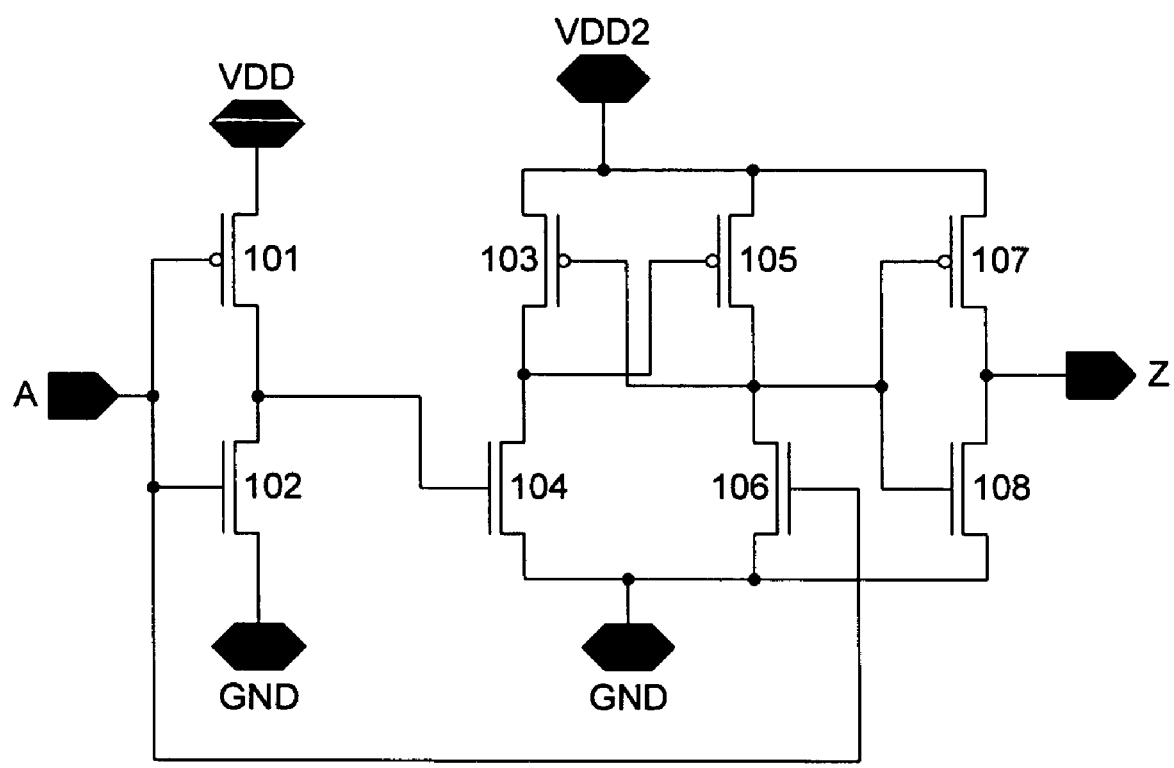
FIG. 1 is schematic diagram illustrating a conventional voltage translator.
Figure 2:
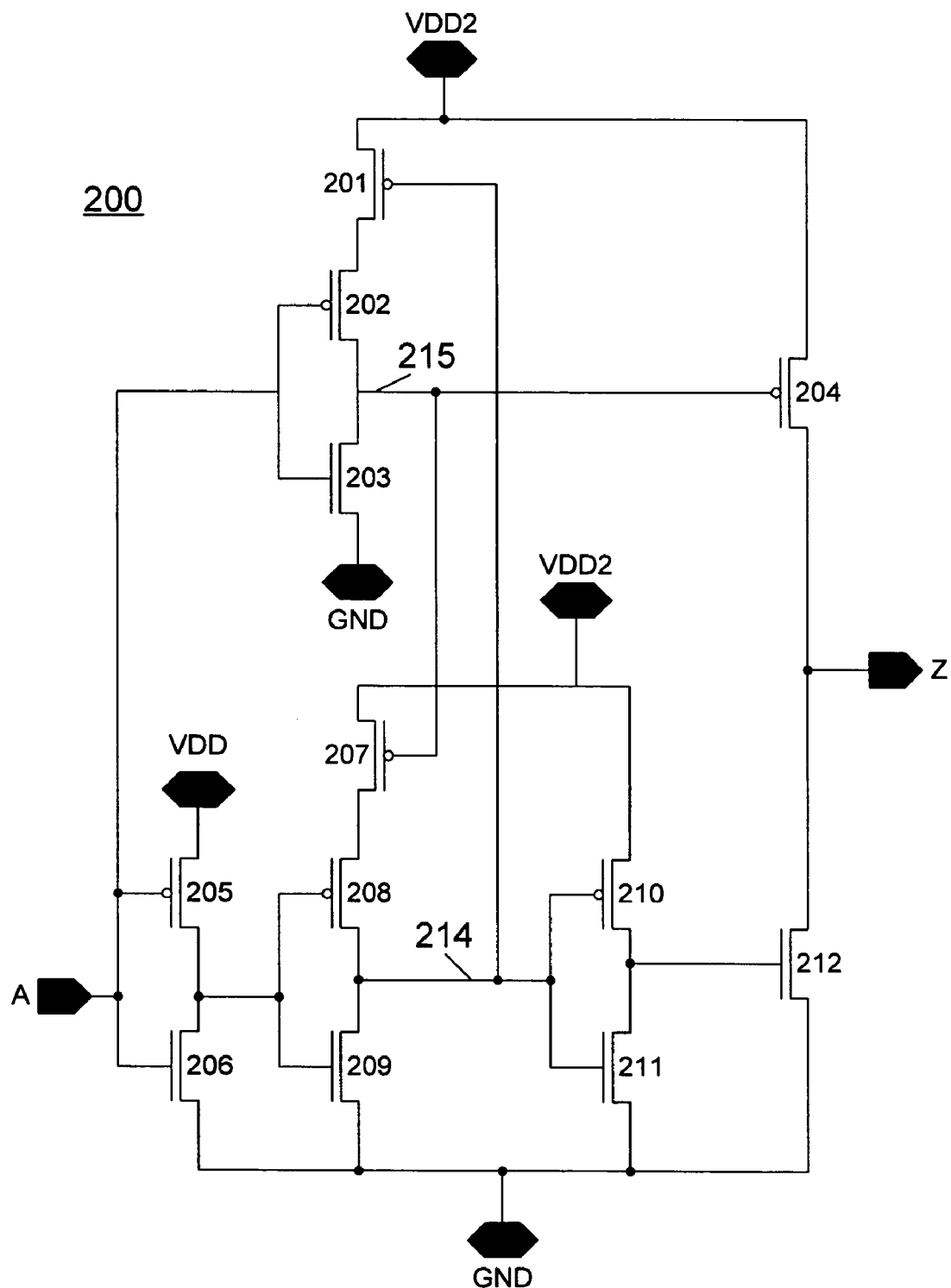
FIG. 2 is schematic diagram illustrating a voltage translator in accordance with the preferred embodiment.

In accordance with features of the preferred embodiment a voltage translator, as illustrated and described with respect to FIG. 2, provides improved tuning enabling balanced operation of an output stage as compared to the prior art voltage translator of FIG. 1. The voltage translator in accordance with the preferred embodiment includes a cross-coupled NOR topology instead of the cross-coupled inverter circuit of the prior art voltage translator of FIG. 1. The cross-coupled NOR topology of the preferred embodiment enables significantly faster switching as compared to the cross-coupled inverter circuit of the prior art voltage translator of FIG. 1. An output PFET and an output NFET of the voltage translator of the preferred embodiment are driven separately, providing enhanced flexibility for tuning both delay and slew rate. Also since an output PFET and an output NFET of the voltage translator of the preferred embodiment are driven separately, shoot through current can be eliminated through the output stage also.

In accordance with features of the preferred embodiment, the voltage translator of the preferred embodiment enables improved performance across various power, voltage and temperature (PVT) conditions. The voltage translator of the preferred embodiment reliably reduces or minimizes shoot through current and delay. The voltage translator of the preferred embodiment is useable as a low or zero shoot through output buffer that combines level translation and predrive circuitry into one stage of logic which inherently and reliably reduces or minimizes shoot through current and delay.

Having reference now to the drawings, in FIG. 2, there is shown a voltage translator in accordance with the preferred embodiment generally designated by reference character 200. Voltage translator 200 includes a cross-coupled NOR topology including a pair of series connected P-channel field effect transistors (PFETs) 201, 202 and an N-channel field effect transistor (NFET) 203 connected between a second voltage supply VDD2 and ground. In a conventional NOR circuit an additional NFET is connected to the common drain connection of PFET 202 and NFET 203. In the cross-coupled NOR topology of voltage translator 200, this additional NFET is not needed and is optional. An output PFET 204 of voltage translator 200 has a gate connected to a common drain connection of PFET 202 and NFET 203. Voltage translator 200 includes an input inverter defined by a series connected PFET 205 and an NFET 206 that is connected between a first voltage supply VDD and ground.

An input A is applied to a gate input of the input inverter defined by PFET 205 and NFET 206 and is applied to a gate of PFET 202 and NFET 203. The cross-coupled NOR circuit includes a second pair of PFETS 207, 208 and an NFET 209 connected between the second voltage supply VDD2 and ground. A series connected PFET 210 and NFET 211 is connected between the second voltage supply VDD2 and ground. The common drain connection of PFET 205 and NFET 206 is connected to a gate of PFET 208 and NFET 209.

In the cross-coupled NOR circuit, the common drain connection of PFET 208 and NFET 209 is connected to a gate of PFET 210 and NFET 211 and also is connected to a gate of PFET 201. The common drain connection of PFET 202 and NFET 203 also is connected to a gate of PFET 207.

An output NFET 212 has a gate connected to a common drain connection of PFET 210 and NFET 211. The output PFET 204 and output NFET 212 are connected in series between the second voltage supply VDD2 and ground and are separately driven by the cross-coupled NOR circuit.

By respectively feeding the gate of the output PFET 204 and output NFET 212 respectively from PFET 202, NFET 204 and PFET 210, NFET 212 at opposite sides of the cross-coupled NOR circuit, the voltage translator 200 can be tuned such that the output NFET 212 is completely off before turning on the output PFET 204. Similarly the voltage translator 200 can be tuned such that the output PFET 204 is completely off before turning on the output NFET 212. In this manner, the output PFET 204 can be modified to speed up or slow down the output slew rate of the rising edge without affecting the falling edge. Similarly the output NFET 212 can be modified to speed up or slow down the output slew rate of the falling edge without affecting the rising edge.

In accordance with features of the preferred embodiment, the rising and falling delays of the voltage translator 200 can be easily tuned by changing the device sizes in the cross-coupled NOR circuit. For example, the width of the NFETs 203, 209 can be increased to decrease the rising and falling delays of the voltage translator 200.

In accordance with features of the preferred embodiment, the use of the cross-coupled NOR circuit effectively eliminates the PFET and NFET competition to switch states of the cross-coupled inverter circuit of FIG. 1. When the input A switches from high to low, the gate of PFET 208 pulls high and shuts off the path from the second voltage supply VDD2 through PFET 207. As a result NFET 209 has no competition from PFET 208 and is able to pull an internal node labeled 214 connected to the drain of NFET 209 down faster. Similarly, when the input A switches from low to high, the gate of PFET 202 pulls high and shuts off the path from the second voltage supply VDD2 through PFET 201. As a result NFET 203 has no competition from PFET 202 and is able to pull an internal node labeled 215 connected to the drain of NFET 203 down faster. Because the circuits are cross coupled, the internal nodes 214, 215 of the voltage translator 200 and the internal nodes in the prior art voltage translator of FIG. 1 only switch as fast as the opposite circuit is able to pull its output low.

In accordance with features of the preferred embodiment, the cross-coupled NOR circuit of the voltage translator 200 is able to switch faster because the additional PFETs 202, 208 eliminate the competition to the NFETs 203, 209 that respectively have a gate input of input A and input A inverse. Because there is no competition to the NFETs 209, 203 to pull the internal cross-coupled nodes 214, 215 low, smaller devices can be used as compared to the devices of the cross-coupled inverter circuit of FIG. 1.

Also even though there are more devices in the voltage translator 200, the voltage translator 200 can be implementing using the same or less area as compared to the prior art voltage translator of FIG. 1 due to the use of smaller devices.

While the present invention has been described with reference to the details of the embodiments of the invention shown in the drawing, these details are not intended to limit the scope of the invention as claimed in the appended claims.

What is claimed is:

1. A voltage translator with data buffer comprising:
an input inverter receiving a data input signal at a first voltage level;
a level shifting cross-coupled NOR circuit coupled to said input inverter for translating said data input signal at a second voltage level, said level shifting cross-coupled NOR circuit being formed by first and second cross-coupled NORs, said first cross-coupled NOR having a first NOR output and said second cross-coupled NOR having a second NOR output, said first cross-coupled NOR receiving inputs of said data input signal and said second NOR output, and said second cross-coupled NOR receiving inputs of an inverted data input signal and said second NOR output; and
an output stage formed by a series connected output P-channel field effect transistor (PFET) and an output N-channel field effect transistor (NFET), each of said output PFET and said output NFET driven by said cross-coupled NOR circuit for providing a data output signal at said second voltage level; said output PFET having a gate directly connected to said first NOR output; and said output NFET having a gate connected via an inverter to said second NOR output.

2. A voltage translator as recited in claim 1 wherein said first and second cross-coupled NORs are formed by a plurality of field effect transistors (FETs).

3. A voltage translator as recited in claim 2 wherein each of said cross-coupled NORs includes a pair of series connected P-channel field effect transistors (PFETs) connected in series with an N-channel field effect transistor (NFET); said series connected PFETs and said NFET connected between said second voltage level and ground.

4. A voltage translator as recited in claim 3 wherein said input inverter provides said inverted data signal and said input inverter includes a series connected P-channel field effect transistor (PFET) and an N-channel field effect transistor (NFET), each having a gate receiving the data input signal.

5. A voltage translator as recited in claim 4 wherein said data input signal is applied to a gate of the NFET and a gate of the PFET series connected to the NFET of the first cross-coupled NOR; said PFET being turned off by an applied gate input that turns on said series connected NFET, enabling faster performance.

6. A voltage translator as recited in claim 4 wherein said inverted data signal is applied to a gate of the NFET and a gate of the PFET series connected to the NFET of the second cross-coupled NOR; said PFET being turned off by an applied gate input that turns on said series connected NFET, enabling faster performance.

7. A voltage translator as recited in claim 2 wherein said output PFET and said output NFET are connected between said second voltage level and ground.

8. A voltage translator as recited in claim 7 wherein said output PFET and said output NFET are driven separately by the respective first and second cross-coupled NORs; said output PFET being completely off before said output NFET is turned on; and said output NFET being completely off before said output PFET is turned on.

9. A voltage translator as recited in claim 1 wherein said output PFET and said output NFET are driven separately by said cross-coupled NOR circuit, enabling independent tuning of output slew rate of a rising edge and a falling edge of said data output signal.

10. A voltage translator as recited in claim 1 wherein said level shifting cross-coupled NOR circuit are formed by a plurality of field effect transistors (FETs); said FETs having a selected size to enable enhanced switching performance and minimize delay.

11. A voltage translator with data buffer comprising:

an input inverter receiving a data input signal at a first voltage level and providing an inverted data signal;

a level shifting cross-coupled NOR circuit coupled to said input inverter for translating said data input signal at a second voltage level; said level shifting cross-coupled NOR circuit being formed by first and second cross-coupled NORs, said first cross-coupled NOR having a first NOR output and said second cross-coupled NOR having a second NOR output, said first cross-coupled NOR receiving inputs of said data input signal and said second NOR output, and said second cross-coupled NOR receiving inputs of an inverted data input signal and said second NOR output; and an output stage for providing a data output signal at said second voltage level; said output stage including an output PFET and an output NFET; said output PFET and said output NFET being separately driven by said cross-coupled NOR circuit; said output PFET having a gate directly connected to said first NOR output; and said output NFET having a gate connected via an inverter to said second NOR output.

12. A voltage translator with data buffer as recited in claim 11 wherein said first and second cross-coupled NORs are formed by a plurality of field effect transistors (FETs).

13. A voltage translator with data buffer as recited in claim 12 wherein each of said first and second cross-coupled NORs include a pair of series connected P-channel field effect transistors (PFETs) connected in series with an N-channel field effect transistor (NFET); said series connected PFETs and said NFET connected between said second voltage level and ground.

14. A voltage translator with data buffer as recited in claim 13 wherein said data input signal is applied to a gate of the NFET and a gate of the PFET series connected to the NFET of the first cross-coupled NOR; said PFET being turned off by an applied gate input that turns on said series connected NFET, enabling faster performance.

15. A voltage translator with data buffer as recited in claim 13 wherein said inverted data signal is applied to a gate of the NFET and a gate of the PFET series connected to the NFET of the second cross-coupled NOR; said PFET being turned off by an applied gate input that turns on said series connected NFET, enabling faster performance.

16. A voltage translator with data buffer as recited in claim 13 wherein said level shifting cross-coupled NOR circuit are formed by a plurality of field effect transistors (FETs); said FETs having a selected size to enable enhanced switching performance and minimize delay.

* * * * *